US011682904B2

(12) United States Patent
Zhu et al.

(10) Patent No.: US 11,682,904 B2
(45) Date of Patent: Jun. 20, 2023

(54) THREE-PHASE AC LOAD UNBALANCE DETECTION AND BALANCING METHOD AND CIRCUIT

(71) Applicant: Cisco Technology, Inc., San Jose, CA (US)

(72) Inventors: Xiqun Zhu, Sunnyvale, CA (US); Sung Kee Baek, San Ramon, CA (US); Robert Gregory Twiss, Chapel Hill, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/484,847

(22) Filed: Sep. 24, 2021

(65) Prior Publication Data

US 2023/0097568 A1    Mar. 30, 2023

(51) Int. Cl.
  *H02J 3/26*      (2006.01)
  *G01R 29/16*     (2006.01)
(52) U.S. Cl.
  CPC .............. *H02J 3/26* (2013.01); *G01R 29/16* (2013.01)
(58) Field of Classification Search
  CPC ..................................................... H02J 3/26
  See application file for complete search history.

(56) References Cited

U.S. PATENT DOCUMENTS

| 4,177,508 A | * | 12/1979 | Schmid ..................... H02J 3/26 363/78 |
| 6,069,779 A | * | 5/2000 | Glavitsch ................. H02J 3/26 361/18 |
| 6,211,681 B1 | | 4/2001 | Kawaga |
| 10,468,964 B1 | * | 11/2019 | Tamir ..................... H02M 1/08 |

(Continued)

FOREIGN PATENT DOCUMENTS

| CN | 106532748 A | * | 3/2017 | |
| CN | 111342480 A | * | 6/2020 | ............... H02J 3/26 |

(Continued)

OTHER PUBLICATIONS

English machine translation of CN106532748A published Mar. 22, 2017. (Year: 2017).*

(Continued)

*Primary Examiner* — Rexford N Barnie
*Assistant Examiner* — David A Shiao
(74) *Attorney, Agent, or Firm* — Edell, Shapiro & Finnan, LLC

(57) ABSTRACT

A method comprises, at a power balancing circuit for three-phase AC power: feeding three power phases to respective loads; measuring power drain on the three power phases by the respective loads; based on measuring, detecting an unbalanced power drain across the three power phases due to a relatively light power drain on one or more lightly loaded power phases and a relatively high power drain on one or more heavily loaded power phases; computing an amount of power to be drained from the one or (Continued)

more lightly loaded power phases and to be fed to the one or more heavily loaded power phases to balance the power drain across the three power phases; and transferring the amount of power from the one or more lightly loaded power phases to the one or more heavily loaded power phases to balance the power drain across the three power phases.

20 Claims, 6 Drawing Sheets

(56) References Cited

U.S. PATENT DOCUMENTS

| | | | |
|---|---|---|---|
| 10,473,729 B2 | 11/2019 | Zhu | |
| 10,718,822 B2 | 7/2020 | Zhu et al. | |
| 2005/0281067 A1 | 12/2005 | Deng et al. | |
| 2006/0012379 A1 | 1/2006 | Shimoe | |
| 2008/0084213 A1 | 4/2008 | Waite | |
| 2010/0054004 A1 | 3/2010 | Royak et al. | |
| 2010/0289343 A1 | 11/2010 | Covaro | |
| 2010/0301883 A1 | 12/2010 | Meyers et al. | |
| 2011/0134669 A1 | 6/2011 | Yuzurihara et al. | |
| 2011/0278931 A1* | 11/2011 | Johnson, Jr. | H02J 3/26 307/66 |
| 2013/0286697 A1 | 10/2013 | Eiland et al. | |
| 2014/0001850 A1* | 1/2014 | Guillemin | H02J 3/26 307/31 |
| 2015/0103574 A1* | 4/2015 | Hintz | H02M 1/42 363/132 |
| 2015/0295508 A1* | 10/2015 | Conry | H02M 5/4585 363/37 |
| 2017/0104362 A1* | 4/2017 | Yang | H02J 7/0068 |
| 2017/0302079 A1* | 10/2017 | Wyma | H02J 3/26 |
| 2018/0074136 A1 | 3/2018 | Zhu et al. | |
| 2018/0217187 A1 | 8/2018 | Urakawa et al. | |
| 2019/0363638 A1* | 11/2019 | Owen | H02J 3/26 |
| 2020/0041579 A1 | 2/2020 | Zhu et al. | |

FOREIGN PATENT DOCUMENTS

| | | | | |
|---|---|---|---|---|
| EP | 2232279 A1 | 9/2010 | | |
| EP | 3545600 B1 * | 3/2021 | | H02J 3/26 |
| JP | 2000055947 A | 2/2000 | | |
| WO | 2019129729 A1 | 7/2019 | | |

OTHER PUBLICATIONS

"Active Load Balancer (ALB)," ELCO Systems, http://www.elcopower.com.my/ALB.html, retrieved Sep. 23, 2021, 6 pages.

Sajid Ul Haq, et al. "Automatic Three Phase Load Balancing System by Using Fast Switching Relay in Three Phase Distribution System," IEEE, retrieved Sep. 24, 2021, 6 pages.

European Search Report in European Application No. EP17189087, dated Jan. 23, 2018, 8 pages.

Office Action in U.S. Appl. No. 16/600,361, filed Oct. 11, 2019, dated Mar. 3, 2020, 40 pages.

Office Action in U.S. Appl. No. 15/261,860, filed Sep. 9, 2016, dated May 10, 2019, 24 pages.

Huawei Technologies Co., Ltd., "TP48300B and V300R001C04 Engineer Manual," Issue 01, Aug. 2012, 44 pages.

Alcatel-Lucent, "Alcatel-Lucent 1665—Data Multiplexer (DMX) | Release 10.0" Applications and Planning Guide, 365-372-300R10.0, Issue 2, Sep. 2013, 860 pages.

Broadcom, "ACPL-C79B-000E—Precision Miniature Isolation Amplifiers," Overview, retrieved from https://www.broadcom.com/products/optocouplers/industrial-plastic/isolation-amplifiers-modulators/isolation-amplifiers/acpl-c79b, on Sep. 27, 2021, 2 pages.

Avago Technologies, "ACPL-C79B, ACPL-C79A, ACPL-C790—Precision Miniature Isolation Amplifiers," Data Sheet, Oct. 2015, 14 pages.

Qu et al., "Reduce Electrical Stresses in a PFC Stage during an AC Drop Test with UCD3138," Texas Instruments, Application Report, SLUA768A—Dec. 2015—Revised Jan. 2018, 8 pages.

* cited by examiner

US 11,682,904 B2

THREE-PHASE AC LOAD UNBALANCE DETECTION AND BALANCING METHOD AND CIRCUIT

TECHNICAL FIELD

The present disclosure relates to power load balancing.

BACKGROUND

For three-phase alternating current (AC) power systems, power load balance across the three phases of AC power (i.e., a balance in power consumed by loads supplied by the three phases) is critical for high overall power system efficiency. However, in reality, it is difficult to keep the power consumed by the loads perfectly balanced across the three phases. An unbalanced load condition (i.e., unbalanced power drain/consumption by the loads) reduces power quality, and may lead to punitive penalty charges from a power utility that supplies the three-phase AC power, for example. An unbalanced load condition can also cause excessive neutral current, resulting in overheating of AC components, such as motors and transformers, power losses, and lower power system efficiencies.

DESCRIPTION OF EXAMPLE EMBODIMENTS

Overview

In an embodiment, a method is performed by a power balancing circuit for three-phase alternating current (AC) power. The method includes separately feeding three power phases of the three-phase AC power to respective loads; measuring power drain on the three power phases by the respective loads; based on measuring, detecting an unbalanced power drain across the three power phases due to a relatively light power drain on one or more lightly loaded power phases and a relatively high power drain on one or more heavily loaded power phases of the three power phases; computing an amount of power to be drained from the one or more lightly loaded power phases and to be fed to the one or more heavily loaded power phases to balance the power drain across the three power phases; and transferring the amount of power from the one or more lightly loaded power phases to the one or more heavily loaded power phases to balance the power drain across the three power phases.

EXAMPLE EMBODIMENTS

Figure 1:
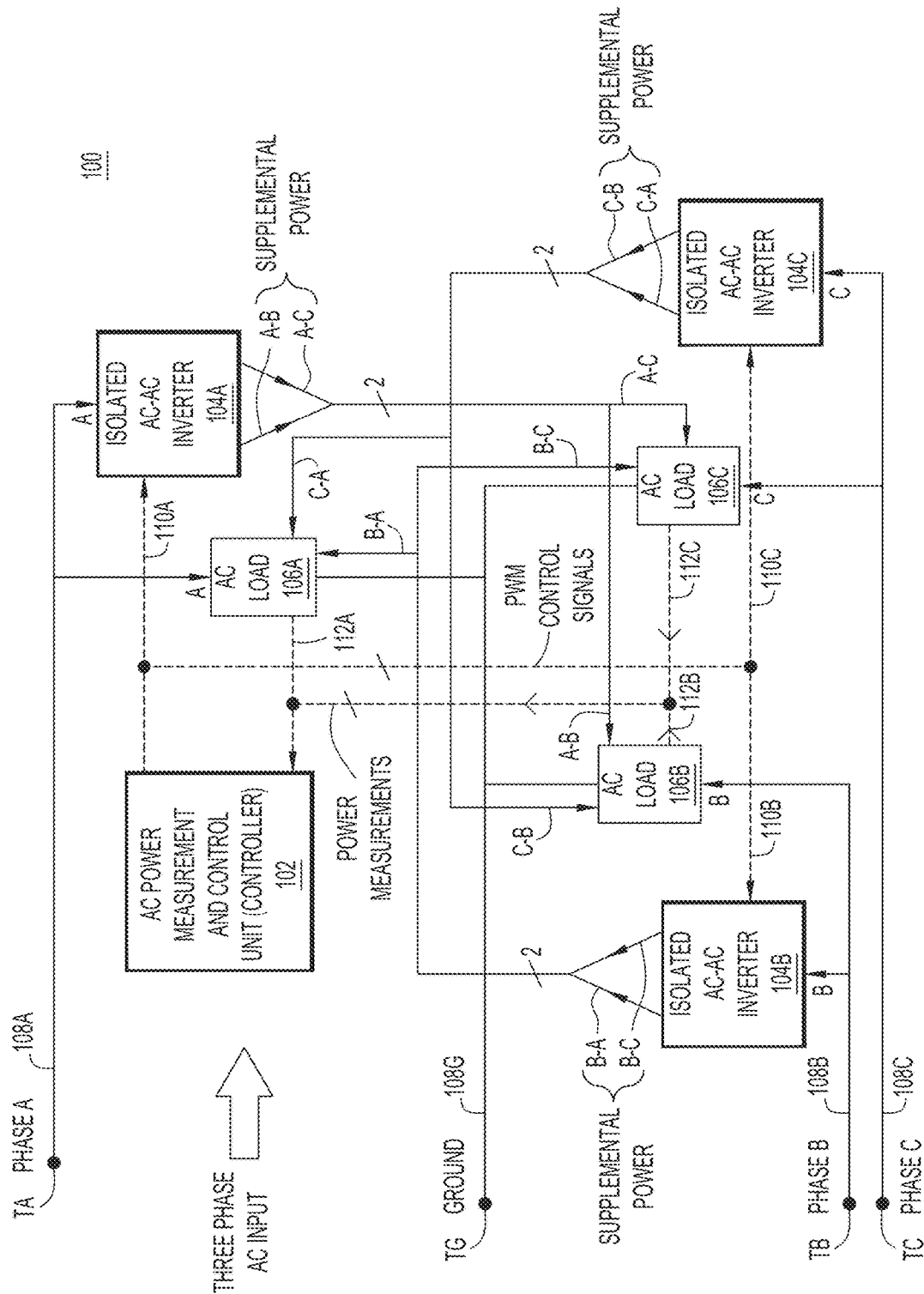
FIG. 1 is a block diagram of an example three-phase AC load unbalance detection and balancing circuit (also referred to simply as a "power balancing circuit"), according to an example embodiment.

FIG. 1 is a block diagram of an example three-phase AC load unbalance detection and balancing circuit (also referred to simply as an "power balancing circuit") 100 configured to perform power load balancing to improve power quality and efficiency of a three-phase AC power system. Power balancing circuit 100 includes an AC power measurement and control unit (also referred to simply a "controller") 102, and isolated AC-to-AC ("AC-AC") power inverters 104A, 104B, and 104C (collectively referred to as "power inverters 104") coupled to each other, the controller, and to power loads 106A, 106B, and 106C (collectively referred to as "loads 106"), which may form part of a larger AC power system (not shown). For example, power balancing circuit 100 may be employed on line cards of network device equipment racks. Each load (e.g., load 106A) depicted individually in FIG. 1 represents a distinct group of one or more component loads, such as tens or even hundreds of computers, routers, switches, motors, lights, heating, ventilation, and air conditioning (HVAC) systems, and the like, for example.

Power balancing circuit 100 includes input terminals TA, TB, and TC to receive (input) phases A, B, and C of three-phase AC power, respectively, while a ground terminal TG represents neutral. Embodiments presented herein are described in the context of a wye type three-phase configuration shown in FIG. 1; however, the embodiments may also be implemented in a delta-type configuration. In the ensuing description, each phase of AC power may also be referred to as a "power phase" or simply "phase." Moreover, it is understood that each phase respectively comprises AC current and AC voltage.

Terminals TA, TB, and TC are coupled to power loads (referred to simply as "loads") 106A, 106B, and 106C via respective input lines or rails 108A, 108B, and 108C (collectively referred to as "input lines 108"), and ground terminal TG is coupled to each of the loads via ground or neutral line 108G. Because loads 106A, 106B, and 106C are fed by phases A, B, and C, respectively, the loads may be referred to as "phase-specific" loads. Each load (e.g., load 106A) respectively includes three power inputs, including (i) a first input coupled to the respective input line (e.g., input line 108A) to receive the respective phase (e.g., phase A) to power the load, and (ii) two supplemental inputs, i.e., a first supplemental input and a second supplemental input, to receive supplemental power to power the load. Each load is configured such that respective powers supplied to the first input, the first supplemental input, and the second supplemental input are summed together (e.g., wire OR-d) at the load, to supply a combined or cumulative power to the load.

As will be described in detail below, power inverters 104A, 104B, and 104C convert phases A, B, and C to supplemental power for phases/loads (B/106B, C/106C), (A/106A, C/106C), and (A/106A, B/106B), respectively, under control of controller 102. Power inverter 104A includes a power input to receive phase A from input terminal TA, control inputs to receive PWM control signals 110A from controller 102, a first power output coupled to the first supplemental input of load 106B, and a second power output coupled to the first supplemental input of load 106C. The first and second power outputs of power inverter 104A are electrically isolated from each other and from the power input. According to PWM control signals 110A, power inverter 104A drains a controlled amount of power from phase A (i.e., the input power) and converts the drained power to (i) supplemental power A-B (for phase B) provided to the first power output of the power inverter, and (ii) supplemental power A-C (for phase C) provided to the second power output of the power inverter. Power inverter 104A provides supplemental power A-B for phase B to the first supplemental input of load 106B and provides supplemental power A-C for phase C to the first supplemental input of load 106C.

Power inverter 104B includes a power input to receive phase B from input terminal TB, control inputs to receive PWM control signals 110B from controller 102, a first power output coupled to the first supplemental input of load 106A, and a second power output coupled to the second supplemental input of load 106C. The first and second power outputs of power inverter 104B are electrically isolated from each other and from the power input. According to PWM control signals 110B, power inverter 104B drains a controlled amount of power from phase B (i.e., the input phase) and converts the drained power to (i) supplemental power B-A (for phase A) provided to the first power output of the power inverter, and (ii) supplemental power B-C (for phase C) provided to the second power output of the power inverter. Power inverter 104B provides supplemental power B-A for phase A to the first supplemental input of load 106A and second supplemental power B-C for phase C to the second supplemental input of load 106C.

Power inverter 104C includes a power input to receive phase C from input terminal TC, control inputs to receive PWM control signals 110C from controller 102, a first power output coupled to the second supplemental input of load 106A, and a second power output coupled to the second supplemental input of load 106B. The first and second power outputs of power inverter 104C are electrically isolated from each other and from the power input. According to PWM control signals 110C, power inverter 104C drains a controlled amount of power from phase C and converts the drained power to (i) supplemental power C-A (for phase A) provided to the first power output of the power inverter, and (ii) supplemental power C-B (for phase B) provided to the second power output of the power inverter. Power inverter 104C provides supplemental power C-A to the second supplemental input of load 106A and second supplemental power C-B to the second supplemental input of load 106B.

Power balancing circuit 100 includes distributed power sensors (not shown) to periodically sense/measure power supplied to (i.e., drained by) each of loads 106A-106C, individually. That is, the power sensors indicate power loading across loads 106. The power sensors provide to controller 102 phase A power measurements 112A, phase B power measurements 112B, and phase C power measurements 112C. In one example, the power sensors may include analog-to-digital converters (ADCs) to digitize phase A, B, and C currents and voltages, and provide their digitized representations or waveforms to controller 102 as the power measurements. In another example, the power sensors may include voltage and current sensors to measure the voltage and current of each phase, and ADCs to digitize the current and voltage measurements, and provide the digitized measurements to controller 102 as the power measurements. An example set of power sensors is described below in connection with FIG. 4.

At a high level, controller 102 monitors the power (and phase) of each of phases A, B, and C (i.e., monitors the current and voltage of each of the phases) as indicated by power measurements 112A, 112B, and 112C, to detect whether the phases are balanced or unbalanced with respect to power loading across the phases. When controller 102 detects that the phases are unbalanced, the controller generates PWM control signals 110A, 110B, and 110C to control power inverters 104A, 104B, and 104C, which in turn control supplemental powers (A-B, A-C), (B-A, B-C), and (C-A, C-B) that are supplied to and summed at loads 106, to restore balance across the phases. For example, when controller 102 detects an unbalance among the three phases, the controller controls one or more of power inverters 104 to drain and convert a certain amount of power, with appropriate phase shifting, from one or more relatively lighter loaded phases to supplemental power, and feed the supplemental power to one or more relatively heavier loaded phase to restore/achieve balance.

Figure 2:
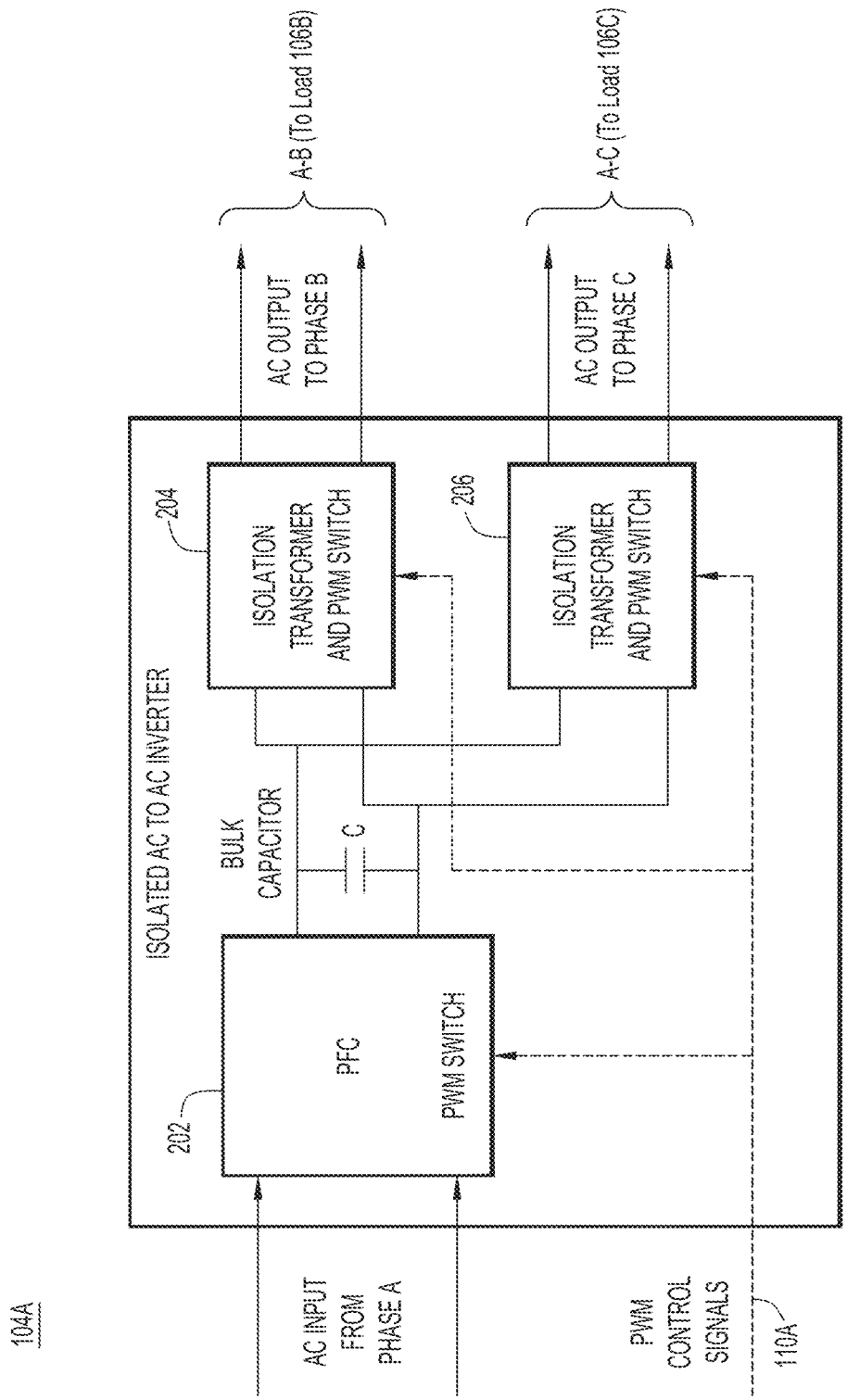
FIG. 2 is a circuit diagram of an AC-to-AC power inverter of the power balancing circuit, according to an example embodiment.

With reference to FIG. 2, there is a circuit diagram of power inverter 104A, according to an embodiment. Power inverter 104A includes a first power module 202 having an input to receive phase A, a second power module 204 having an input coupled to an output of the first power module, a third power module 206 having an input coupled to the output of the first power module, and an internal energy storage (bulk) capacitor C also coupled to the output of the first power module. First, second, and third power modules 202, 204, and 206 each receive one or more of PWM control signals 110A. PWM control signals 110A control ON/OFF switching duty cycles and phases of PWM switches employed in first, second, and third power modules 202, 204, and 206, as described below. Thus, PWM control signals 110A are sometimes referred to as PWM switch control signals.

First power module 202 includes power factor correction (PFC) circuitry and PWM switches that collectively control the amount of power drained from phase A and a power factor of the drained power relative to the other phases in response to PWM control signals, to produce PFC-controlled intermediate phase A power. First power module 202 provides the PFC-controlled intermediate phase A power to the inputs of second power module 204 and third power module 206.

Second power module 204 includes PWM switches and an isolation transformer coupled to the PWM switches. The PWM switches of second power module 204 convert the PFC-controlled intermediate phase A power to supplemental power A-B for phase B (to be supplied to load 106B and summed with phase B) having (i) a controlled magnitude responsive to PWM control signals 110A, and (ii) a controlled phase that matches the phase of phase B. That is, power inverter 104A phase shifts power converted from phase A to supplemental power A-B so that the phase of supplemental power A-B matches that of phase B. Second power module 204 provides supplemental power A-B to the first supplemental input of load 106B through the isolation transformer of the first power module. Therefore, supplemental power A-B is electrically isolated from phase A (which is provided to the input of first power module 202). The operation of first power module 202 and second power module 204 together results in a transfer of a controlled amount of power from phase A to phase B under control of PWM control signals 110A.

Third power module 206 is configured similarly to second power module 204, and operates in parallel with the second power module. Third power module includes PWM switches and an isolation transformer coupled to the PWM switches. The PWM switches of third power module 206 convert the PFC-controlled intermediate phase A power to supplemental power A-C for phase C (to be supplied to load 106C and summed with phase C) having (i) a controlled magnitude responsive to PWM control signals 110A, and (ii) a controlled phase that matches the phase of phase C. That is, power inverter 104A phase shifts power converted from phase A to supplemental power A-C so that the phase of supplemental power A-C matches that of phase C. Third power module 206 provides supplemental power A-C to the first supplemental input of load 106C through the isolation transformer of the second power module. Therefore, supplemental power A-C is electrically isolated from phase A. Supplemental powers A-B and A-C are provided to their respective loads in parallel. The operation of first power module 202 and third power module 206 together results in a transfer of a controlled amount of power from phase A to phase C under control of PWM control signals 110A.

Power inverters 104B and 104C are each configured similarly to power inverter 104A, so the description provided above for power inverter 104A shall suffice for the other power inverters, except for the following differences. Power inverter 104B converts phase B to (i) supplemental power B-A for phase A, and that has a phase that matches the phase of phase A, and (ii) supplemental power B-C for phase C, and that has a phase that matches the phase of phase C. Power inverter 104C converts phase C to (i) supplemental power C-A for phase A, and that has a phase that matches the phase of phase A, and (ii) supplemental power C-B for phase B, and that has a phase that matches the phase of phase B.

Because each load (e.g., load 106A) at each phase A, B, and C has three power inputs, including one power input for its own phase (e.g., phase A) and two power inputs for supplemental powers having matching phases that are produced by corresponding power inverters (e.g., power inverters 104B, 104C) that are not power inverter 104A, the magnitudes of the supplemental powers may be fine-tuned by the corresponding power inverters to achieve balanced load sharing among each of the three phases. That is, each load can take power from its own phase only or take a certain amount of power from the other phases as well through the corresponding power inverters. Moreover, when one phase has failed, power from the other phases may be transferred to the load that would normally receive the failed phase via the supplemental powers generated by the power inverters that do not receive the failed phase as an input phase.

In addition to the load balancing described above in connection with FIG. 1, and further below, controller 102 controls the respective first power module 202 of each of power inverters 104 to drain their respective input phases with a phase pattern that ensures phases of currents supplied to the power inverters follow a standard three-phase voltage waveform to drive a power factor as close to 100% as possible. To help achieve this goal, the internal energy storage capacitor C of each of the power inverters is sized to hold/store energy for half cycles of the PWM control signals. The capacitor C represents a memory buffer that helps each power inverter to control magnitudes and phases of currents supplied to the inputs of the power inverters, and magnitudes and phases of the supplemental currents provided at the outputs of the power inverters, to meet particular current/voltage phase patterns that maintain high power factors of all phases.

Figure 3:
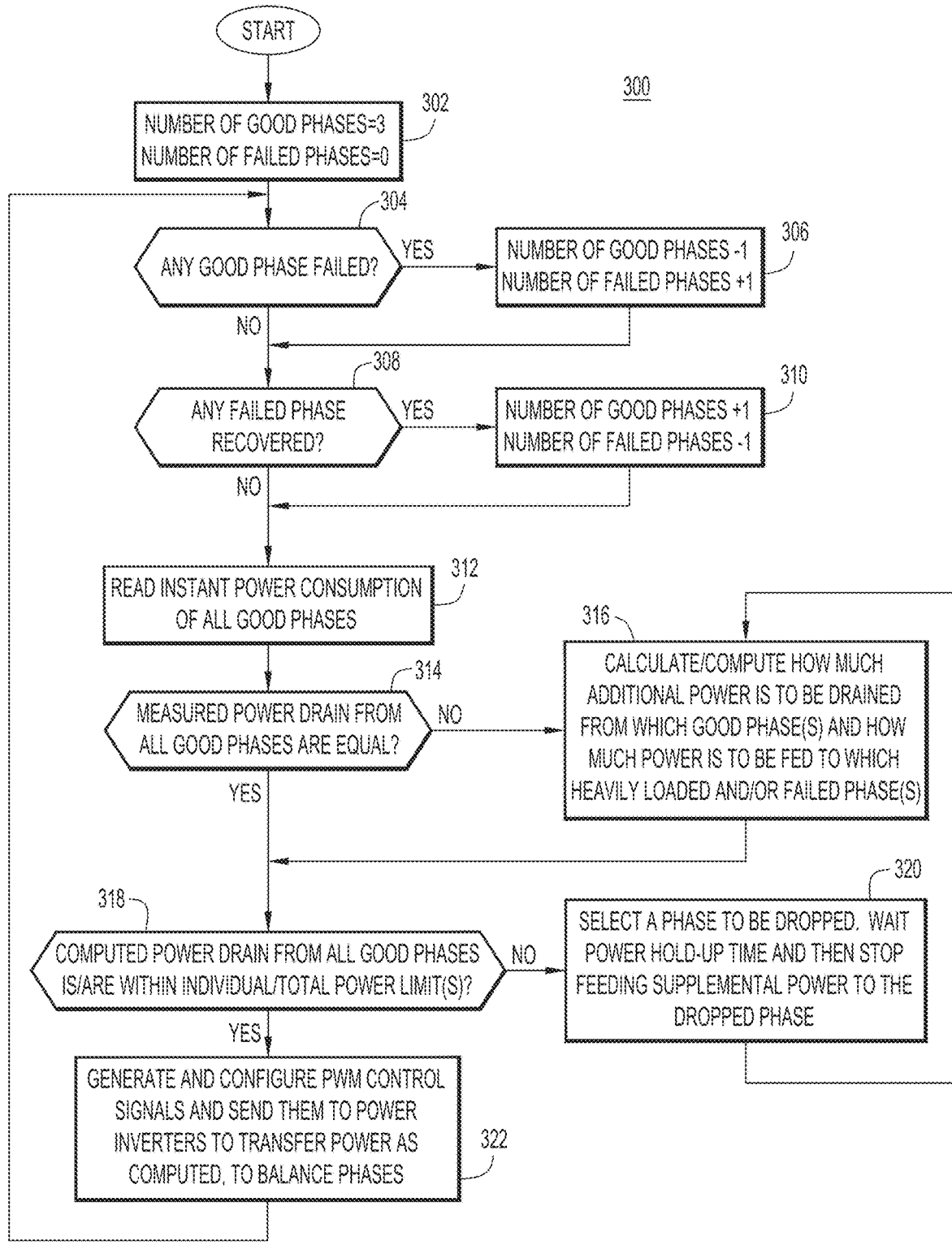
FIG. 3 is a flowchart of a method performed by the power balancing circuit, according to an example embodiment.

With reference to FIG. 3, there is a flowchart of an example method 300 performed by power balancing circuit 100. Method 300 combines three-phase power monitoring, balancing, and compensation for failed phases. Method 300 includes various operations described above, and additional operations.

At 302, controller 102 initializes a number of good phases=3 and a number of failed phases=0. Controller 102 monitors power measurements 112A, 112B, and 112C for failed phase conditions. A good phase is a phase that is present and being supplied from its respective input terminal to it respective load. A failed phase is a phase that is no longer present (i.e., that has zero current) and thus is not being supplied to its corresponding load.

At 304-310, controller 102 tracks the number and identities of good phases and the number and identities of failed phases, based on the monitoring. At 304, controller 102 determines whether any good phase has failed, e.g., whether any phase has zero current, which would indicate the phase has failed. If any good phase has failed, flow proceeds to 306, and if no good phase has failed, flow proceeds to 308. At 306, controller 102 decrements the number of good phases, and increments the number of failed phases, then flow proceeds to 308. At 308, controller 102 determines whether any failed phase has recovered. If a failed phase has recovered, flow proceeds to 310, and if a failed phase has not recovered, flow proceeds to 312. At 310, controller 102 increments the number of good phases and decrements the number of failed phases, then flow proceeds to 312.

At 312, controller 102 monitors power measurements 112A, 112B, and 112C for load unbalance across the phases. Flow proceeds to 314.

At 314, based on the monitoring, controller 102 determines whether all of the (good) phases are balanced, e.g., whether power drains on all of the phases are equal. Controller 102 also determines whether any of the phases have failed based on the tracking of failed phases performed in operations 304-310. When either of the aforementioned conditions are true, i.e., when controller 102 detects an unbalance (also referred to as an "imbalance") among the phases, or when there are one or more failed phases, flow proceeds to 316. Alternatively, when neither of the aforementioned conditions are true, i.e., when all of the phases are balanced and when there are no failed phases, flow proceeds to 318.

At 316, when a detected unbalance arises from a condition of relatively light power drain on one or more lightly loaded (good) phases and a relatively high power drain (that is higher than the relatively low power drain) on one or more heavily loaded (good) phases, controller 102 computes an amount of additional/extra power that is to be drained from each of the one or more lightly loaded phases and transferred to each of the one or more heavily loaded phases in the form of supplemental power to balance all of the phases. In other words, controller 102 computes the amount of power (referred to as "computed power drains") to be transferred from the one or more lightly loaded phases to the one or more heavily loaded phases in the form of supplemental power.

When there are one or more failed phases, controller 102 computes the amount of power to be transferred between the remaining phases (i.e., the good phases that have not failed) and to the one or more failed phases to maintain balance across the remaining phases and the one or more failed phases. For example, to compensate for a failed phase, controller 102 determines how to control power inverters 104 that are receiving the remaining phases (but not the power inverter that receives the failed phase) to continuously convert some of the power from the remaining phases to supplemental power to be transferred to the failed phase, i.e., provided to the load that received the failed phase. Flow proceeds to 318.

At 318, controller 102 determines whether the computed power drains from the one or more lightly loaded phases are within individual power limits for the one or more lightly loaded phases, i.e., whether the computed power drains, when actually implemented, will cause the power drains to exceed their individual power limits. Alternatively, or additionally, controller 102 may determine whether a total power drain computed across all of the phases is within (i.e., does not exceed) a total power limit. When any of the computed power drains exceeds its/their individual power limit(s), or when the computed total power drain exceeds the total power limit, flow proceeds to 320. If neither of the aforementioned conditions are true, flow proceeds to 322.

At 320, controller 102 selects a phase to be dropped. In an embodiment, controller 102 also sends an AC power failure signal to the load fed by the phase that is to be dropped, e.g., to all of the various component loads comprising that load, to give the various component loads a chance to shut-down their respective applications (both hardware and software) in a controlled way before the phase is actually dropped. After the selection and sending of the AC power failure signal, controller 102 waits a predetermined hold-up time period. When the hold-up time period expires, controller 102 controls power inverters 104 to drop the selected phase, i.e., to stop feeding supplemental power (i.e., stop transferring power) to the dropped phase so that the power inverters do not transfer power from the other phases to the dropped phase. In an example, the three phases are assigned predetermined priorities from high to low, and controller 102 selects, as the dropped phase, the phase with the lowest priority. In another example, controller 102 may select, as the dropped phase, the most heavily loaded phase or, alternatively, the least loaded phase. Other selection strategies may be used.

At 322, controller 102 controls power inverters 104A, 104B and 104C to actually implement the power transfers between phases as computed at 318 and 320. That is, controller 102 generates PWM control signals 110A, 110B and 110B to control power inverters 104A, 104B, and 104B to implement the power transfer strategies computed at 316 and 320. Method 300 repeats.

Operation of power balancing circuit 100 in accordance with method 300 is now described with reference to an example. In the example, controller 102 monitors power measurements 112A, 112B, and 112C and, based on the monitoring, detects an unbalance condition in which phase A is more heavily loaded than both phases B and C. Upon detecting the unbalance condition, controller 102 generates PWM control signals 110B and 110C to cause:

a. Power inverter 104B to drain a controlled amount of phase B power (e.g., phase B current) and convert the drained phase B power to a controlled increase in magnitude of supplemental power B-A (e.g., supplemental current B-A) for phase A, which is fed into phase A power (e.g., phase A current) at load 106A. Supplemental power B-A and phase A power have matched phases. Thus, power inverter 104B transfers a portion of phase B power to phase A power at load 106A in the form of supplemental power B-A.

b. Power inverter 104C to drain a controlled amount of phase C power and convert the drained phase C power to a controlled increase in magnitude of supplemental power C-A, which is fed into the phase A power at load 106A in parallel with supplemental power B-A. Supplemental power C-A and phase A power have matched phases. Thus, power inverter 104C transfers a portion of phase C power to phase A power at load 106A in the form of supplemental power C-A.

The supplemental powers (e.g., currents) B-A and C-A are summed with the phase A power (e.g., current) at load 106A. The operation effectively reduces the loading on phase A at the expense of additional loading on each of phases B and C.

Figure 4:
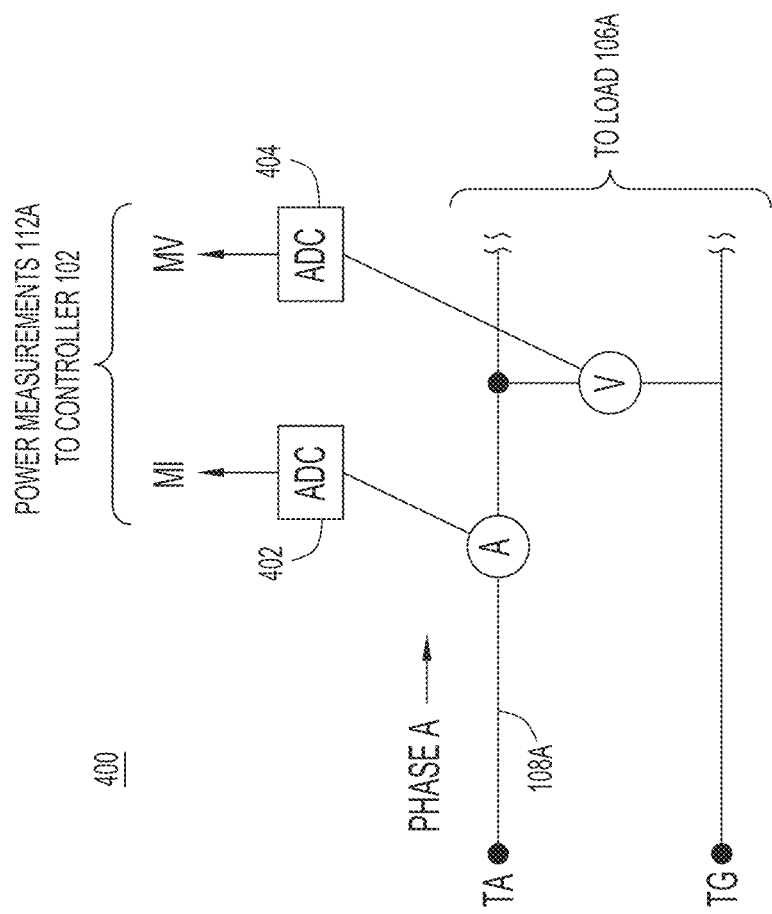
FIG. 4 is a circuit diagram of power sensors associated with phase A of three-phase AC power, according to an example embodiment.

With reference to FIG. 4, there is a circuit diagram of an example power sensor arrangement 400 associated with phase A. Power sensor arrangement 400 includes a current sensor A and a voltage sensor V coupled to terminal TA and load 106A to provide analog current and voltage measurements of phase A to inputs of respective ADCs 402 and 404. ADC 402 digitizes the analog current measurement into a digitized current measurement MI and provides the same to controller 102. ADC 404 digitizes the analog voltage measurement into a digitized voltage measurement MV and provides the same controller 102. Respective power sensors associated with phases B and C may be configured similarly to the power sensors in FIG. 4.

The embodiments presented above may be enhanced in order to prevent back feeding of phase(s). To this end, a back-feeding prevention switch (BFPS) may be coupled to the three phases. The BFPS includes a back-feeding detection circuit, a recovery detection circuit, and a large (i.e., high power handling) physical switch capable of switching on and off tens of kilowatts of power to the loads, and capable of handling the huge inrush current that results. The back-feeding detection circuit monitors the current of each phase to determine whether a back-feeding condition occurs. Upon detection of the back-feeding condition, the physical switch is turned off to prevent further back feeding. The turned off phase(s) are powered completely by the remaining phase(s) through power inverters 104. After the physical switch is turned off, the recovery detection circuit continuously detects and determines if phase power is recovered. If it is recovered, then the physical switch is turned back on to restore normal power feeding operations.

Figure 5:
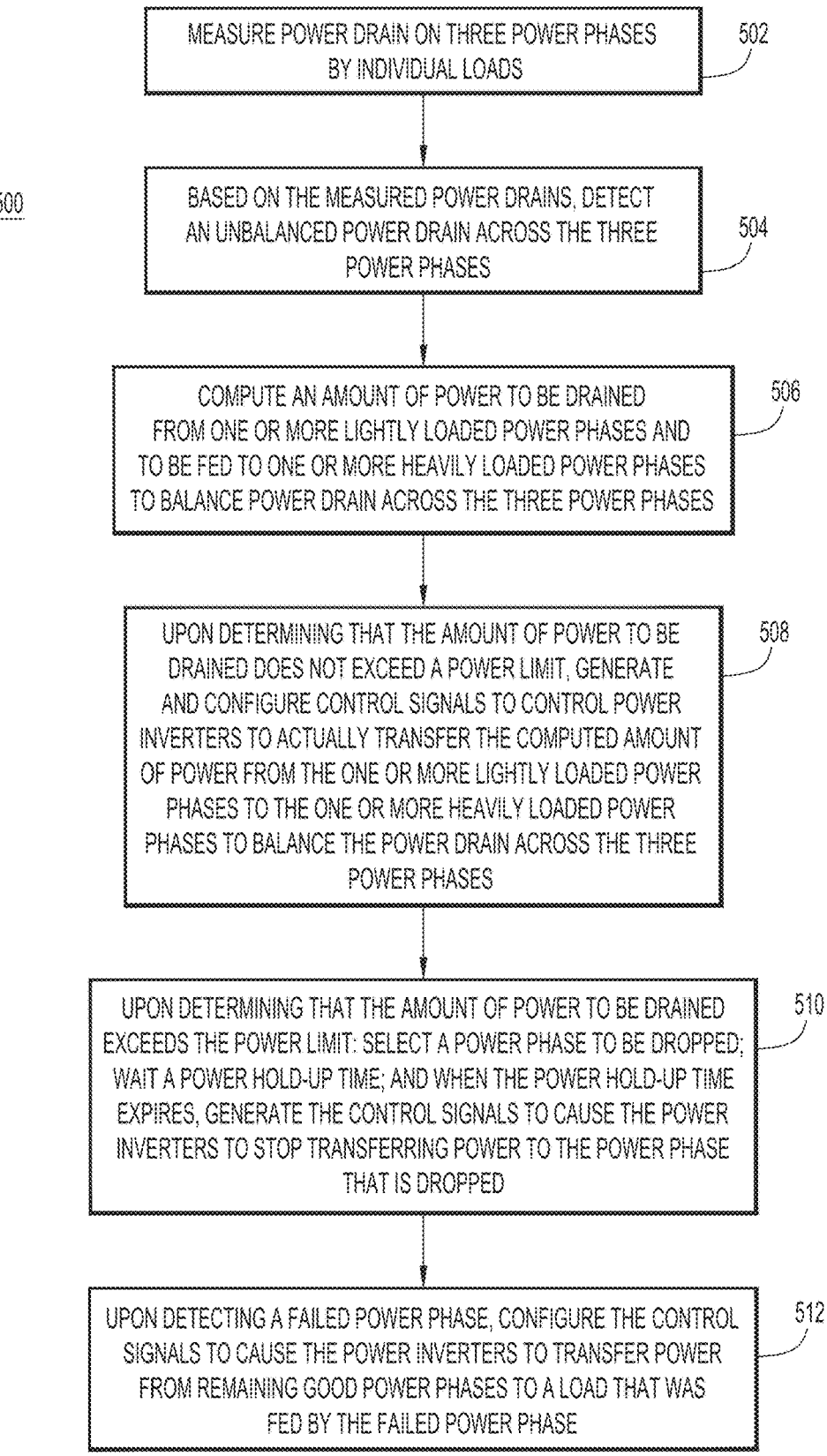
FIG. 5 is a flowchart of a method of performing load balancing, performed by the load balancing circuit, according to an example embodiment.

FIG. 5 is a flowchart of an example method 500 of performing load balancing using power balancing circuit 100. Method 500 assumes terminals TA, TB, and TC separately feed three power phases A, B, and C of three phase AC power to respective/phase-specific loads 106A, 106B, and 106C (e.g., one phase per load).

At 502, power sensors measure power drain on the three power phases by the respective/phase-specific loads, and provide their measurements to a controller (e.g., controller 102).

At 504, the controller monitors the measurements and, based on the monitoring, detects an unbalanced power drain across the three power phases due to a relatively light power drain on one or more lightly loaded power phases and a relatively high power drain on one or more heavily loaded power phases of the three power phases.

At 506, the controller computes an amount of power to be drained from the one or more lightly loaded power phases and to be fed to the one or more heavily loaded power phases to balance the power drain across the three power phases.

At 508, upon determining that the amount of power to be drained from the one or more lightly loaded power phases does not exceed a power limit (which may be a per-phase power limit or a total power limit) for the one or more lightly loaded power phases, the controller generates and configures (PWM) control signals to control power inverters to actually transfer the computed amount of power from the one or more lightly loaded power phases to the one or more heavily loaded power phases to balance the power drain across the three power phases. The transfer includes, for each lightly loaded power phase, used as an input power phase:

a. Converting the input power phase into one or more supplemental power phases corresponding to, and having phases that match, the one or more heavily loaded power phases that are not the input power phase.

b. Summing the one or more supplemental power phases with the one or more heavily loaded power phases at one or more of the respective/phase-specific loads fed by the one or more heavily loaded power phases.

At 510, upon determining that the computed amount of power to be drained from the one or more lightly loaded power phases exceeds the power limit, the controller:
  a. Selects a power phase among the three power phases that is to be dropped.
  b. Optionally sends an AC power failure signal to the load fed by the phase that is to be dropped (e.g., to all of the various component loads comprising that load, to give the various component loads a chance to shut-down their respective applications—both hardware and software—in a controlled way).
  c. Waits a power hold-up time after the selection in (a) and the sending in (b) (if used).
  d. When the power hold-up time expires, controls the power inverters to stop transferring power from the good phases that are not dropped to the power phase that is dropped, i.e., to stop supplying supplemental power to the dropped phase and its associated load.

At 512, upon detecting a failed power phase among the three power phases, the controller configures the control signals to cause the power inverters to transfer power from good power phases among the three power phases that are not failed power phases to a load among the respective/phase-specific loads that was fed by the failed power phase, i.e., to supply supplemental powers from the good phases to the failed power phase.

Figure 6:
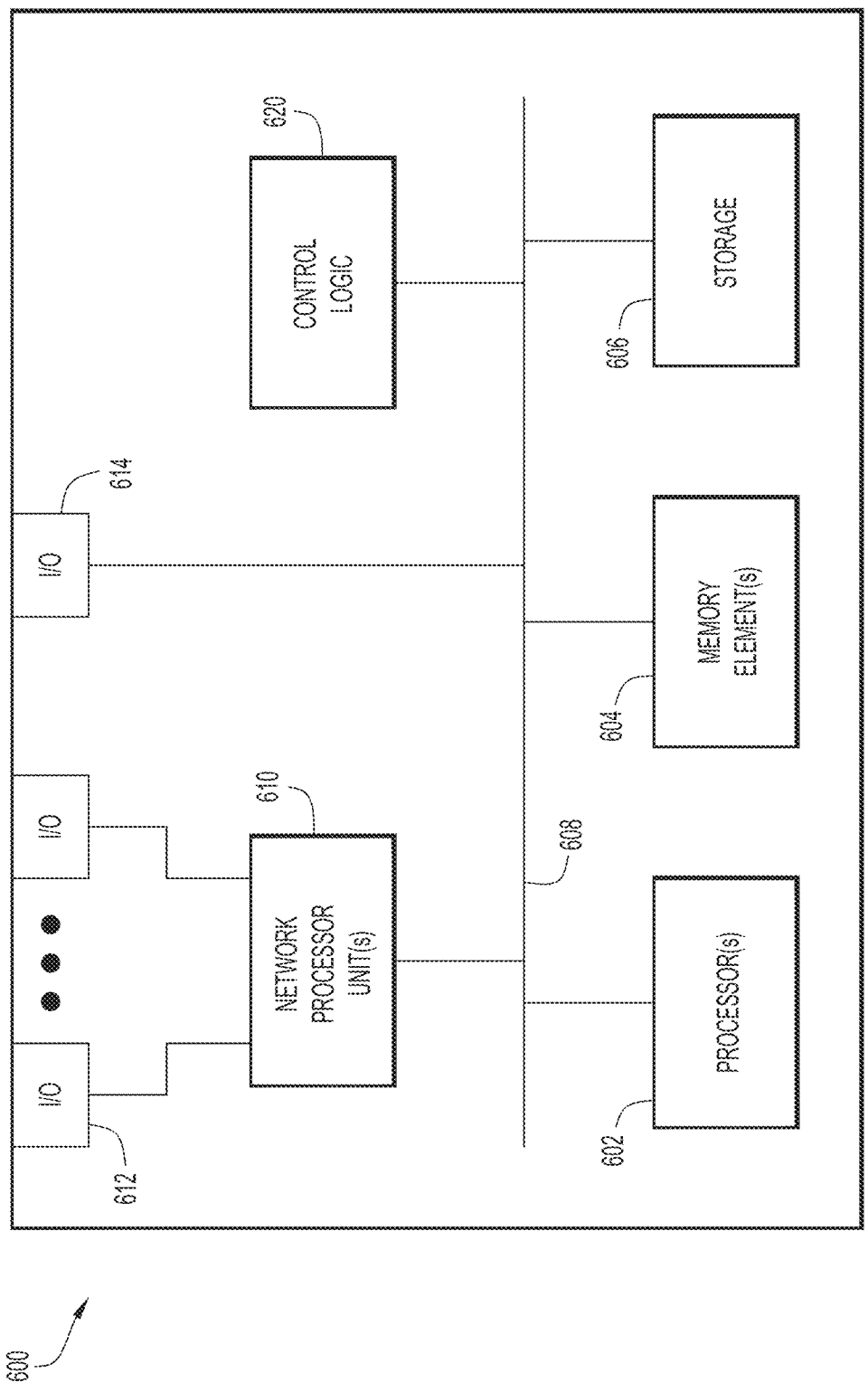
FIG. 6 is a hardware block diagram of a computer device with which the power balancing circuit may be integrated, according to an example embodiment.

FIG. 6 is an illustration of a hardware block diagram of a computing device 600 that may perform functions associated with operations discussed herein in connection with the techniques depicted in FIGS. 1-5. In various embodiments, a computing device or apparatus, such as computing device 600 or any combination of computing devices 600, may be configured as any entity/entities as discussed for the techniques depicted in connection with FIGS. 1-5 in order to perform operations of the various techniques discussed herein. Various components of power balancing circuit 100 shown in FIG. 1 may be integrated with computing device 600. For example, controller 102 of may include a combination of components of computing device 600 described below.

In at least one embodiment, the computing device 600 may be any apparatus that may include one or more processor(s) 602, one or more memory element(s) 604, storage 606, a bus 608, one or more network processor unit(s) 610 interconnected with one or more network input/output (I/O) interface(s) 612, one or more I/O interface(s) 614, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory element(s) 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, network processor unit(s) 610 may enable communication between computing device 600 and other systems, entities, etc., via network I/O interface(s) 612 (wired and/or wireless) to facilitate operations discussed for various embodiments described herein. In various embodiments, network processor unit(s) 610 can be configured as a combination of hardware and/or software, such as one or more Ethernet driver(s) and/or controller(s) or interface/line cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 600 and other systems, entities, etc. to facilitate operations for various embodiments described herein. In various embodiments, network I/O interface(s) 612 can be configured as one or more Ethernet port(s), Fibre Channel ports, any other I/O port(s), and/or antenna(s)/antenna array(s) now known or hereafter developed. Thus, the network processor unit(s) 610 and/or network I/O interface(s) 612 may include suitable interfaces for receiving, transmitting, and/or otherwise communicating data and/or information in a network environment.

I/O interface(s) 614 allow for input and output of data and/or information with other entities that may be connected to computer device 600. For example, I/O interface(s) 614 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 620 can include instructions that, when executed, cause processor(s) 602 to perform operations, which can include, but not be limited to, providing overall control operations of computing device;

interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory element(s) 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm·wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

In summary, embodiments presented herein provide a method and circuit to detect three-phase unbalance and, in response, transfer power from relatively lighter loading phase(s) to relatively heavier loaded phase(s) to reach balance among different phases. The embodiments achieve better load balancing among three phases to improve the power quality and efficiency of an overall power system, avoid punitive penalty charges from a power utility, and reduce operation expenses. The embodiments may include: a first, second, and third input terminals to separately feed three phases of power, including first, second, and third power phases, to first, second, and third (phase-specific) loads, respectively; power sensors to provide power drain measurements for the three power phases; first, second, and third power inverters each configured to receive a respective one of the first, second, and third power phases as an input phase, each power inverter respectively configured to, in response to control signals, (i) convert the input phase to first and second supplemental powers having respective phases that match phases of two of the three phases that are not the input phase, and (ii) provide the first and second supplemental powers to respective ones of the first, second, and third loads that are not the one of the loads that is fed by the input phase; and a controller coupled to the power sensors and the first, second, and third power inverters, and configured to generate the control signals responsive to monitoring the power drain measurements.

In summary, in one form, a method is provided comprising: at a power balancing circuit for three-phase alternating current (AC) power: separately feeding three power phases of the three-phase AC power to respective loads; measuring power drain on the three power phases by the respective loads; based on measuring, detecting an unbalanced power drain across the three power phases due to a relatively light power drain on one or more lightly loaded power phases and a relatively high power drain on one or more heavily loaded power phases of the three power phases; computing an amount of power to be drained from the one or more lightly loaded power phases and to be fed to the one or more heavily loaded power phases to balance the power drain across the three power phases; and transferring the amount of power from the one or more lightly loaded power phases to the one or more heavily loaded power phases to balance the power drain across the three power phases.

In the method, the transferring may include, for each lightly loaded power phase, used as an input power phase: converting the input power phase into one or more supplemental power phases corresponding to, and having phases that match, the one or more heavily loaded power phases that are not the input power phase; and summing the one or more supplemental power phases with the one or more heavily loaded power phases at one or more of the respective loads fed by the one or more heavily loaded power phases.

In the method, the converting may include converting the input power phase to the one or more supplemental power phases using a respective AC-to-AC inverter having a power input to receive the input power phase, and two power outputs respectively coupled to the respective loads fed by the one or more heavily loaded power phases. The converting may also include, for each input power phase, electrically isolating the input power phase from each of the one or more supplemental power phases. The converting may also include, for each input power phase, phase shifting a phase of the input power phase to produce the one or more supplemental power phases having the phases that match the one or more heavily loaded power phases.

The method may further comprise, upon determining that the amount of power to be drained from the one or more lightly loaded power phases does not exceed a power limit for the one or more lightly loaded power phases, performing the transferring. The method may further comprise, upon determining that the amount of power to be drained from the one or more lightly loaded power phases exceeds the power limit: selecting a power phase to be dropped among the three power phases; waiting a power hold-up time after selecting; and when the power hold-up time expires, stopping transferring power to the power phase that is dropped. The selecting may include selecting the power phase to be dropped based on predetermined priorities of the three power phases.

In the method, the detecting may include detecting a failed power phase among the three power phases based on monitoring, and the transferring may include transferring power from good power phases among the three power phases that are not failed power phases to a load among the respective loads that was fed by the failed power phase.

In another form, an apparatus is provided comprising: input terminals to separately feed three power phases of AC power to respective loads; power sensors to provide power drain measurements for the three power phases; power inverters configured to transfer controlled amounts of power from the three power phases to the respective loads in response to control signals; and a controller configured to perform: based on the power drain measurements, detecting an unbalanced power drain across the three power phases due to a relatively light power drain on one or more lightly loaded power phases and a relatively high power drain on one or more heavily loaded power phases of the three power phases; computing an amount of power to be drained from the one or more lightly loaded power phases and to be fed to the one or more heavily loaded power phases to balance power drain across the three power phases; and configuring the control signals to cause the power inverters to transfer the amount of power from the one or more lightly loaded power phases to the one or more heavily loaded power phases to balance the power drain across the three power phases.

In the apparatus, each power inverter that is configured to receive one of the one or more lightly loaded power phases as an input power phase may be configured to transfer the amount of power by: converting the input power phase into one or more supplemental power phases corresponding to, and having phases that match, the one or more heavily loaded power phases that are not the input power phase, and providing the one or more supplemental power phases to one or more of the respective loads that are fed by the one or more heavily loaded power phases, respectively, wherein the one or more supplemental power phases are summed with the one or more heavily loaded power phases at one or more of the respective loads fed by the one or more heavily loaded power phases.

In the apparatus, the power inverters may each include (i) a power input to receive a respective one of the three power phases as an input power phase, and (ii) two power outputs coupled to respective ones of the respective loads that are not fed by the input power phase. The power inverters may each be configured to electrically isolate the power input from each of the two power outputs.

In the apparatus, the controller may be configured to perform: upon determining that the amount of power to be drained from the one or more lightly loaded power phases does not exceed a power limit for the one or more lightly loaded power phases, configuring the control signals to cause the power inverters to transfer the amount of power from the one or more lightly loaded power phases to the one or more heavily loaded power phases.

The controller may be further configured to perform: upon determining that the amount of power to be drained from the one or more lightly loaded power phases exceeds the power limit: selecting a power phase to be dropped among the three power phases; waiting a power hold-up time after selecting; and when the power hold-up time expires, configuring the control signals to cause the power inverters to stop any transfer of power to the power phase that is dropped. The controller may be configured to perform selecting by selecting the power phase to be dropped based on predetermined priorities of the three power phases.

The controller may be further configured to perform, upon detecting a failed power phase among the three power phases based on monitoring, generating the control signals to cause power inverters of the power inverters that are fed by good power phases among the three power phases that are not the failed power phase to transfer power from the good power phases to the failed power phase.

In yet another form, a non-transitory computer readable medium is provided. The computer readable medium is encoded with instruction that, when executed by a controller of a power balancing circuit for three-phase alternating current (AC) having three power phases of AC that feed respective loads, the power balancing circuit including power sensors to provide power drain measurements for the three power phases, and power inverters configured to transfer controlled amounts of power from the three power phases to the respective loads in response to control signals generated by the controller, cause the controller to perform: based on the power drain measurements, detecting an unbalanced power drain across the three power phases due to a relatively light power drain on one or more lightly loaded power phases and a relatively high power drain on one or more heavily loaded power phases of the three power phases; computing an amount of power to be drained from the one or more lightly loaded power phases and to be fed to the one or more heavily loaded power phases to balance power drain across the three power phases; and configuring the control signals to cause the power inverters to transfer the amount of power from the one or more lightly loaded power phases to the one or more heavily loaded power phases to balance the power drain across the three power phases.

Each power inverter that is configured to receive one of the one or more lightly loaded power phases as an input power phase may be configured to transfer the amount of power by: converting the input power phase into one or more supplemental power phases corresponding to, and having phases that match, the one or more heavily loaded power phases that are not the input power phase, and providing the one or more supplemental power phases to one or more of the respective loads that are fed by the one or more heavily loaded power phases, respectively, wherein the one or more supplemental power phases are summed with the one or more heavily loaded power phases at one or more of the respective loads fed by the one or more heavily loaded power phases. The power inverters may each include (i) a power input to receive a respective one of the three power phases as an input power phase, and (ii) two power outputs coupled to respective ones of the respective loads that are not fed by the input power phase.

The above description is intended by way of example only. Various modifications and structural changes may be made therein without departing from the scope of the concepts described herein and within the scope and range of equivalents of the claims.

What is claimed is:

1. A method comprising:
    at a power balancing circuit for three-phase alternating current (AC) power:
    separately feeding three power phases of the three-phase AC power to respective loads, wherein the power balancing circuit includes three AC-to-AC power inverters, each having an input connected to a respective one of the three power phases and two outputs respectively connected to each other ones of the three power phases;
    measuring power drain on the three power phases by the respective loads;
    based on the measuring, detecting an unbalanced power drain across the three power phases due to a relatively light power drain on one or more lightly loaded power phases and a relatively high power drain on one or more heavily loaded power phases of the three power phases;
    computing an amount of power to be drained from the one or more lightly loaded power phases and to be fed to the one or more heavily loaded power phases to balance the power drain across the three power phases;
    controlling one or more of the three AC-to-AC power inverters to perform transferring the amount of power from the one or more lightly loaded power phases to the one or more heavily loaded power phases to balance the power drain across the three power phases; and
    upon determining that the amount of power to be drained from the one or more lightly loaded power phases exceeds a power limit for the one or more lightly loaded power phases, stopping the transferring of power by the one or more of the three AC-to-AC power inverters to a power phase selected to be dropped among the three power phases.

2. The method of claim 1, wherein the transferring includes, for each lightly loaded power phase, used as an input power phase:
    converting the input power phase into one or more supplemental power phases corresponding to, and having phases that match, the one or more heavily loaded power phases that are not the input power phase; and
    summing the one or more supplemental power phases with the one or more heavily loaded power phases at one or more of the respective loads fed by the one or more heavily loaded power phases.

3. The method of claim 2, wherein the three AC-to-AC power inverters are electrically isolated from each other.

4. The method of claim 2, wherein the converting includes, for each input power phase:
    electrically isolating the input power phase from each of the one or more supplemental power phases.

5. The method of claim 2, wherein the converting includes, for each input power phase:
    phase shifting a phase of the input power phase to produce the one or more supplemental power phases having the phases that match the one or more heavily loaded power phases.

6. The method of claim 1, further comprising:
    upon determining that the amount of power to be drained from the one or more lightly loaded power phases does not exceed the power limit for the one or more lightly loaded power phases, performing the transferring.

7. The method of claim 6, further comprising, upon determining that the amount of power to be drained from the one or more lightly loaded power phases exceeds the power limit:
    selecting a power phase to be dropped among the three power phases as the power phase selected to be dropped;
    waiting a power hold-up time after selecting; and
    when the power hold-up time expires, stopping the transferring power to the power phase that is dropped.

8. The method of claim 7, wherein the selecting includes selecting the power phase to be dropped based on predetermined priorities of the three power phases.

9. The method of claim 1, wherein:
    the detecting further includes detecting a failed power phase among the three power phases based on monitoring; and
    the transferring further includes transferring power from good power phases among the three power phases that are not failed power phases to a load among the respective loads that was fed by the failed power phase.

10. An apparatus comprising:
    input terminals to separately feed three power phases of AC power to respective loads;
    power sensors to provide power drain measurements for the three power phases;
    three AC-to-AC power inverters each configured to transfer controlled amounts of power from a respective one of the three power phases to each other ones of the three power phases and to the respective loads in response to control signals; and
    a controller configured to perform:
        based on the power drain measurements, detecting an unbalanced power drain across the three power phases due to a relatively light power drain on one or more lightly loaded power phases and a relatively high power drain on one or more heavily loaded power phases of the three power phases;
        computing an amount of power to be drained from the one or more lightly loaded power phases and to be fed to the one or more heavily loaded power phases to balance power drain across the three power phases;
        configuring the control signals to cause one or more of the three AC-to-AC power inverters to transfer the amount of power from the one or more lightly loaded power phases to the one or more heavily loaded power phases to balance the power drain across the three power phases; and
        upon determining that the amount of power to be drained from the one or more lightly loaded power phases exceeds a power limit for the one or more lightly loaded power phases, stopping the transferring of power by the one or more of the three AC-to-AC power inverters to a power phase selected to be dropped among the three power phases.

11. The apparatus of claim 10, wherein each AC-to-AC power inverter that is configured to receive one of the one or more lightly loaded power phases as an input power phase is configured to transfer the amount of power by:
converting the input power phase into one or more supplemental power phases corresponding to, and having phases that match, the one or more heavily loaded power phases that are not the input power phase, and providing the one or more supplemental power phases to one or more of the respective loads that are fed by the one or more heavily loaded power phases, respectively,
wherein the one or more supplemental power phases are summed with the one or more heavily loaded power phases at one or more of the respective loads fed by the one or more heavily loaded power phases.

12. The apparatus of claim 10, wherein the three AC-to-AC power inverters each includes (i) a power input to receive a respective one of the three power phases as an input power phase, and (ii) two power outputs coupled to respective ones of the respective loads that are not fed by the input power phase.

13. The apparatus of claim 12, wherein the three AC-to-AC power inverters are each configured to electrically isolate the power input from each of the two power outputs.

14. The apparatus of claim 10, wherein the controller is further configured to perform:
upon determining that the amount of power to be drained from the one or more lightly loaded power phases does not exceed the power limit for the one or more lightly loaded power phases, configuring the control signals to cause one or more of the three AC-to-AC power inverters to transfer the amount of power from the one or more lightly loaded power phases to the one or more heavily loaded power phases.

15. The apparatus of claim 14, wherein the controller is further configured to perform:
upon determining that the amount of power to be drained from the one or more lightly loaded power phases exceeds the power limit:
selecting a power phase to be dropped among the three power phases as the power phase selected to be dropped;
waiting a power hold-up time after selecting; and
when the power hold-up time expires, configuring the control signals to cause the three AC-to-AC power inverters to stop any transfer of power to the power phase that is dropped.

16. The apparatus of claim 15, wherein the controller is configured to perform selecting by selecting the power phase to be dropped based on predetermined priorities of the three power phases.

17. The apparatus of claim 10, wherein the controller is further configured to perform:
upon detecting a failed power phase among the three power phases based on monitoring, generating the control signals to cause one or more of the three AC-to-AC power inverters that are fed by good power phases among the three power phases that are not the failed power phase to transfer power from the good power phases to the failed power phase.

18. A non-transitory computer readable medium encoded with instructions that, when executed by a controller of a power balancing circuit for three-phase alternating current (AC) having three power phases of AC that feed respective loads, the power balancing circuit including power sensors to provide power drain measurements for the three power phases, and three AC-to-AC power inverters configured to transfer controlled amounts of power from the three power phases to the respective loads in response to control signals generated by the controller, wherein each AC-to-AC power inverter has an input connected to a respective one of the three power phases and two outputs respectively connected to other ones of the three power phases, cause the controller to perform:
based on the power drain measurements, detecting an unbalanced power drain across the three power phases due to a relatively light power drain on one or more lightly loaded power phases and a relatively high power drain on one or more heavily loaded power phases of the three power phases;
computing an amount of power to be drained from the one or more lightly loaded power phases and to be fed to the one or more heavily loaded power phases to balance power drain across the three power phases;
configuring the control signals to cause one or more of the three AC-to-AC power inverters to transfer the amount of power from the one or more lightly loaded power phases to the one or more heavily loaded power phases to balance the power drain across the three power phases; and
upon determining that the amount of power to be drained from the one or more lightly loaded power phases exceeds a power limit for the one or more lightly loaded power phases, stopping the transferring of power by the one or more of the three AC-to-AC power inverters to a power phase selected to be dropped among the three power phases.

19. The non-transitory computer readable medium of claim 18, wherein each power inverter that is configured to receive one of the one or more lightly loaded power phases as an input power phase is configured to transfer the amount of power by:
converting the input power phase into one or more supplemental power phases corresponding to, and having phases that match, the one or more heavily loaded power phases that are not the input power phase, and providing the one or more supplemental power phases to one or more of the respective loads that are fed by the one or more heavily loaded power phases, respectively,
wherein the one or more supplemental power phases are summed with the one or more heavily loaded power phases at one or more of the respective loads fed by the one or more heavily loaded power phases.

20. The non-transitory computer readable medium of claim 18, wherein the three AC-to-AC power inverters are electrically isolated from each other.

* * * * *